United States Patent
Foster, Sr. et al.

(10) Patent No.: US 7,377,751 B2
(45) Date of Patent: May 27, 2008

(54) COOLING FAN AND SHROUD WITH MODIFIED PROFILES

(75) Inventors: Jimmy G. Foster, Sr., Morrisville, NC (US); Michael S. June, Raleigh, NC (US); Albert V. Makley, Raleigh, NC (US); Jason A. Matteson, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 11/184,195

(22) Filed: Jul. 19, 2005

(65) Prior Publication Data

US 2007/0020098 A1    Jan. 25, 2007

(51) Int. Cl.
*F04D 19/00* (2006.01)

(52) U.S. Cl. .................. 416/169 A; 416/189; 416/192; 416/223 R; 416/228; 416/238; 416/DIG. 2; 416/DIG. 5; 415/220; 415/222

(58) Field of Classification Search ............ 416/169 A, 416/189, 192, 223 R, 228, 238, DIG. 2, DIG. 5; 415/173.1, 173.5, 220, 208.1, 211.1, 222
See application file for complete search history.

(56) References Cited

U.S. PATENT DOCUMENTS

| | | | |
|---|---|---|---|
| 3,727,593 A | * | 4/1973 | Enke ........................ 415/178 |
| 5,520,513 A | | 5/1996 | Kuroki et al. |
| 6,183,221 B1 | * | 2/2001 | Hsieh ........................ 415/220 |
| 6,454,527 B2 | * | 9/2002 | Nishiyama et al. ......... 415/119 |
| 6,595,744 B2 | * | 7/2003 | Van Houten ............. 415/173.1 |
| 6,600,249 B2 | * | 7/2003 | Nelson et al. ................ 310/91 |
| 2003/0034153 A1 | | 2/2003 | Hitt et al. |

FOREIGN PATENT DOCUMENTS

| | | |
|---|---|---|
| JP | 3011114 A | 1/1991 |
| JP | 7217434 A | 8/1995 |
| JP | 7238832 A | 9/1995 |
| JP | 2001165094 A | 6/2001 |

\* cited by examiner

*Primary Examiner*—Igor Kershteyn
(74) *Attorney, Agent, or Firm*—Martin McKinley, Esq.; Steven M. Greenberg, Esq.; Carey Rodriguez Greenberg & Paul LLP

(57) ABSTRACT

A cooling system includes a cooling fan with an outlet and an inlet and a shroud surrounding at least a portion of the cooling fan. The cooling fan includes a plurality of fan blades, and each fan blade includes an inlet portion and an outlet portion that define an outer periphery of the fan blade. The outlet portion has a profile defined by a radial distance, perpendicular from a central axis of the fan, increasing in a direction towards the outlet. The average angle, relative to a central axis of the fan, of either a profile of the outlet portion or a profile of a portion of the shroud surrounding the outlet portion is between about ±15° of an average angle to the central axis at which a flow of fluid exits the outer periphery of the fan blades or between about 20° and about 70°.

8 Claims, 2 Drawing Sheets

COOLING FAN AND SHROUD WITH MODIFIED PROFILES

BACKGROUND OF THE INVENTION

1. Field of the Invention

The disclosure relates generally to cooling systems for computer systems and, more specifically, to a cooling system for reducing noise and improving volumetric output of the cooling system.

2. Description of the Related Art

While the recent increase in the speed of microprocessors has significantly increased the processing capability of computers, this increase in speed has resulted in additional heat being generated by the processor and/or other components within a computer system. Many of these components, including the processor, are adversely affected by high temperatures; and thus, a need exists for dissipating the excess heat. Typically, a heat sink is thermally attached to an integrated circuit package containing the processor or other chip, and a cooling fan is used to force air over the heat sink.

A rapidly growing area of interest for customers of computer systems is acoustics or noise. Many customers place significant emphasis on the acoustical characteristics of a system in valuing the quality of the system. Currently, the primary elements operative in the production of system acoustical noise are the computer system's various electro-mechanical cooling fans, such as system fans, microelectronic component fans, and power supply fans.

An issue associated with current fans involves striking a balance between improving volumetric output through the cooling fan (i.e., increased cooling) and reducing the acoustical output of the fan. Although solutions currently exist to increase the output through the cooling fan, these solution negatively affect the acoustics of the fan. For example, increasing the speed (i.e., RPM) of the cooling fan increases acoustical output. Adding flow straighteners to the exhaust of the cooling fan, which turn airflow "swirl" energy into potential pressure drop energy, is another example, but the flow straighteners also increase acoustical output.

FIGS. 1 and 2 respectively illustrate the presumed (FIG. 1) and actual (FIG. 2) flow of fluid F exiting a conventional cooling fan 210. Although a common presumption is that fluid F exits the fan 210 at a vector normal to a frame 220 of the fan 210 or parallel to a rotational axis RA of the fan 210, this is not correct. As known to those experienced in fans and/or fluid aerodynamics, the actual characteristics of fluid F exiting the fan 210 differ significantly from the characteristics shown in FIG. 1.

As illustrated in FIG. 2, the actual vector of fluid F exiting the fan 210 is at a angle that away from the rotation axis RA of the fan 210. This angle can be 45° or even greater. The angled vector of fluid F exiting the fan 210 results from fluid radially moving away from the hub 212 and along the surfaces of the fan blades. The exact angle the fluid exits the fan 210 depends upon several known factors, such as the pitch angle and shape of the blades.

A conventional cooling fan 110 and shroud 120 and how fan noise is created is illustrated in FIG. 3. The conventional fan 110 includes blades 114, each having an outer periphery 118 that is substantially parallel to a rotational axis RA of the fan 110. The shroud 120 surrounds, in part, the blades 114, and a substantially constant width gap separates the periphery 118 of the fan blades from the shroud 120. Since the fluid F exits the outer periphery 118 at an angle relative to the rotational axis RA, the fluid F impacts the shroud 120, which reflects the fluid F back into the fan 110.

The turbulence or swirl created in the fluid F causes the shroud 120 to vibrate, thus creating acoustical emissions from the fan/shroud assembly. The turbulence within the fluid F also acts as in impedance to the fluid F through the fan 120, which reduces the maximum volumetric output of fluid F of the fan 120. The impingement of the fluid F on the shroud 120 also increases the resistance of fluid F through the fan 120. There is, therefore, a need to improve the volumetric output of fluid through a cooling fan while at the same time reducing the acoustical output of the fan.

BRIEF SUMMARY OF THE INVENTION

Embodiments of the invention address deficiencies of the art in respect to cooling systems and provide a novel and non-obvious method, system and apparatus for improving the volumetric output of fluid through a cooling fan of a cooling system while reducing acoustical output of the cooling system. In this regard, the cooling system includes a cooling fan having an outlet and an inlet and a shroud surrounding at least a portion of the cooling fan. The cooling fan includes a plurality of fan blades, and each fan blade includes an inlet portion and an outlet portion that define an outer periphery of the fan blade. The outlet portion has a profile defined by a radial distance, perpendicular from a central axis of the fan, increasing in a direction towards the outlet. The average angle, relative to a central axis of the fan, of either a profile of the outlet portion or a profile of a portion of the shroud surrounding the outlet portion is between about ±15° of an average angle, relative to the central axis, at which a flow of fluid exits the outer periphery of the fan blades is between about 20° and about 70°.

At least a portion of the outlet portion is substantially linear. Also, an intersection point between the inlet portion and the outlet portion is between about 25% to about 75% of a distance between an outermost point of the inlet portion in a direction towards the inlet to an outermost point of the outlet portion in a direction towards the outlet. The average angle of a profile of the inlet portion to the central axis is different than an average angle of the profile of the outlet portion to the central axis. Additionally, the portion of the shroud surrounding the outlet portion is substantially parallel to the outlet portion.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein.

DETAILED DESCRIPTION OF THE INVENTION

Figure 1:
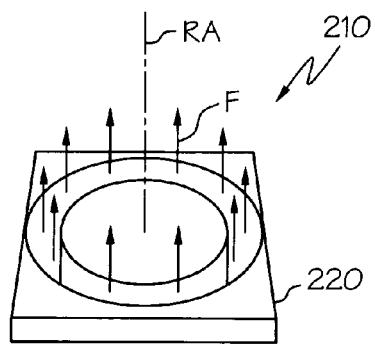
FIG. 1 is a perspective illustration of a presumed flow of fluid exiting a fan.
Figure 2:
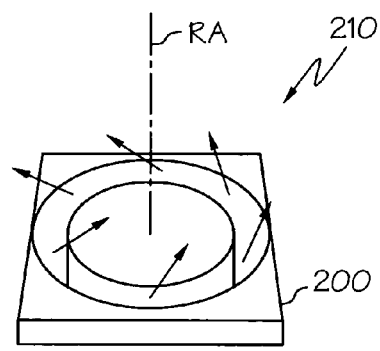
FIG. 2 is a perspective illustration of an actual flow of fluid exiting a fan.
Figure 3:
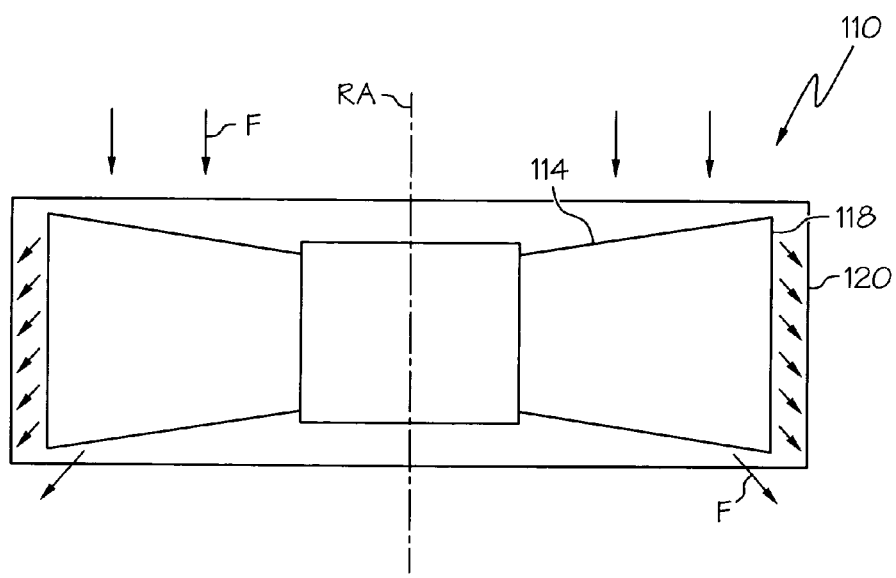
FIG. 3 is a side view of a conventional cooling fan.
Figure 4:
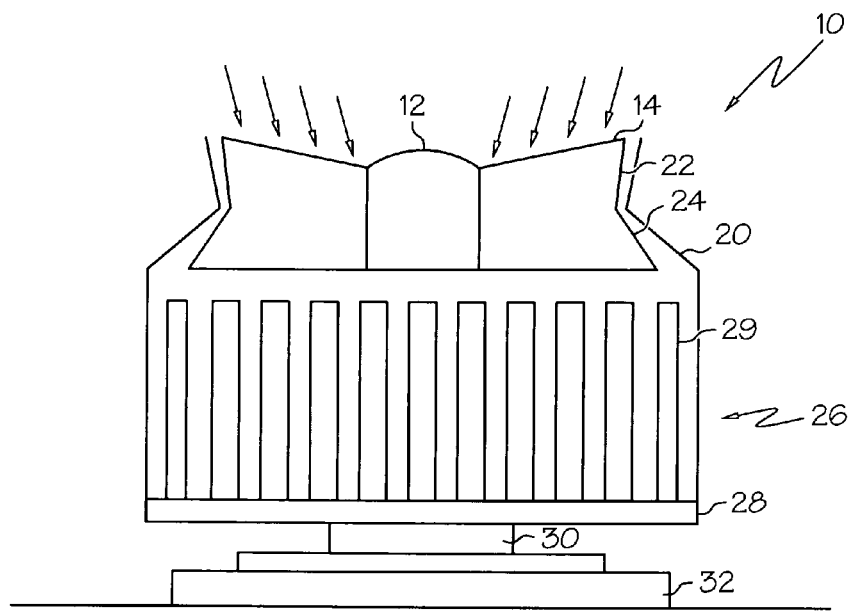
FIG. 4 is a side view of a cooling fan system configured in accordance with the inventive arrangements.

FIG. 4 illustrates a cooling device for a component of a computer system according to the present disclosure. The cooling device includes a fan 10 that directs a flow of fluid, such as air, to a heat exchanger 26 that is thermally connected to the computer processor 30. A shroud 20 surrounds, at least in part, the fan 10 and the heat exchanger 26 to assist directing the flow of fluid from the fan 10 to the heat exchanger 26. Although not limited in this manner, a computer processor 30 may be seated within a socket 32 that is attached to a circuit board.

Many different types of heat exchangers 26 capable of being used to cool a computer processor 30 are known to those in the computer industry, and the present heat exchanger 26 is not limited to a particular type so capable. One type of heat exchanger 26, as illustrated, includes a heat sink 28 that is thermally connected to the processor 30 using, for example, a thermal paste. Fins 29 extend from the heat sink 28, and flow from the fan 10 is directed over surfaces on the fins 29 to cool the fins 29, which through a well-known mechanism, also cools the processor 30.

Figure 5:
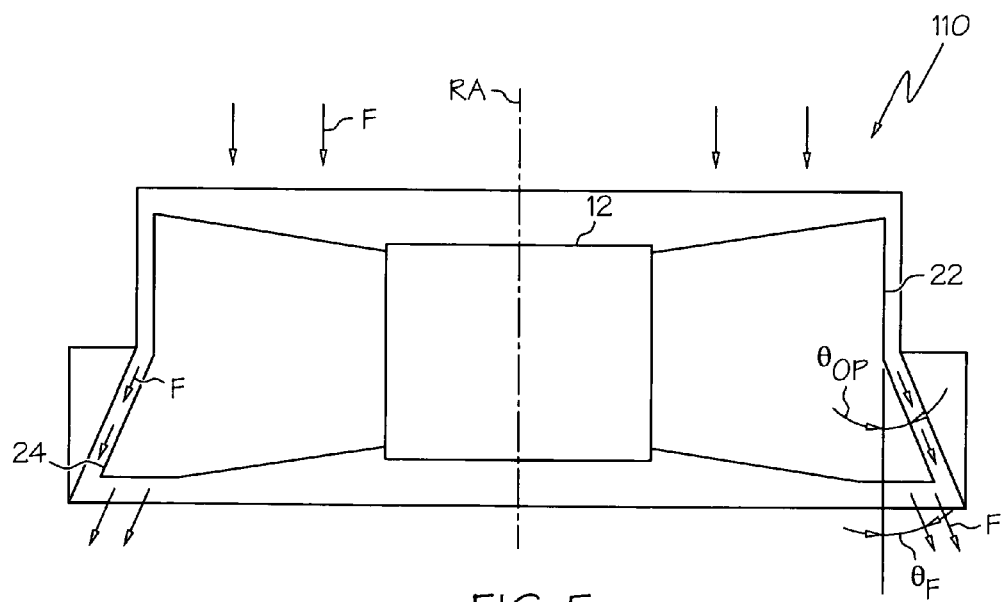
FIG. 5 is a larger side view of the cooling fan illustrated in FIG. 4.

A closer view of the fan 10 and the shroud 20 according to the disclosure is illustrated in FIG. 5. The fan includes a hub 12 to which fan blades 14 are attached. The hub 12 is attached to a rotor (not shown) that is rotated, for example, by an electric motor. Alternatively, the blades 14 may be directly attached to the rotor, which also acts as the hub 12 of the fan 10. The outer periphery of each blade 14 includes an inlet portion 22 and at least one outlet portion 24. An average angle of the profile of the inlet portion 22 relative to the rotational axis RA of the fan 10 may be different than an average angle of the profile of the outlet portion 24 relative to the rotational axis RA of the fan 10.

The outlet portion 24 is defined by a radial distance perpendicular from the rotational axis RA of the fan 10 increasing in a direction towards the outlet of the fan 10, and one end of the outlet portion 24 may be defined by the outlet of the fan 10. The outlet portion 24 is not limited as to the rate at which the radial distance increases. For example, the rate of change in radial distance may increase in the direction of the outlet of the fan 10, which results in the outlet portion 24 having a curvilinear profile (not shown). Alternatively, as illustrated, the rate of change in radial distance may be constant in the direction of the outlet of the fan 10, which results in the outlet portion 24 having a straight profile having a defined angle $\theta_{OP}$ relative to a line parallel to the rotational axis RA.

In certain aspects of the fan 10, the defined angle $\theta_{OP}$ of the outlet portion 24 is between about 20° and about 70°. In a current aspect of the fan 10, the defined angle $\theta_{OP}$ is between about 35° and about 55°. In other aspects of the fan 10, the defined angle $\theta_{OP}$ of the outlet portion 24 is selected to be substantially identical to an average angle $\theta_F$ at which the flow F exits an outer periphery of the fan blades 14, for example, within ±15°, and in certain aspects within ±5°.

If the blades 14 include multiple outlet portions 24 (not shown), the outlet portions 24 differ from one another by the type of profile. For example, one may be curvilinear and another portion may be substantially linear or straight. As another example, if the outlet portions 24 are straight, the outlet portions 24 may have different defined angles $\theta_{OP}$ relative to a line parallel to the rotational axis RA.

The inlet portion 22 of each blade 14 receives the incoming flow F of fluid. An outer profile of the inlet portion 22 is not limited as to particular type of profile. However, to maximize an inlet area of the fan 10, the profile of the inlet portion 22 may be substantially parallel with a rotational axis RA of the fan or have an increasing radial distance perpendicular from the rotational axis RA of the fan 10 in a direction of the inlet of the fan 10.

The intersection between the inlet portion 22 and the outlet portion 24 of each blade 24 is not limited as to a particular location. However, in certain aspects of the fan 10, the intersection is between about 25% to 75% of a distance between an outermost point of the inlet portion 22 in the direction towards the inlet to an outermost point of the outlet portion 22 in a direction towards the outlet. In other aspects of the fan 10, the intersection is between about 40% to about 60% of the distance.

In a region surrounding the fan 10, the shroud 20 may be configured to be substantially parallel with the profiles of the inlet portion 22 and the outlet portion 24 of the fan blades 14. In this manner is substantially constant distance is maintained between the inlet and outlet portions 22, 24 of the fan blades 14 and the shroud 20. In addition to, or alternatively, an angle of the shroud 20, in a region surrounding the outlet portion, may be configured to be substantially identical to an average angle $\theta_F$ at which the flow F exits the sides of the fan blades 14, for example, within ±15°, and in certain aspects within ±5°.

By having the shroud 20 and/or outlet portion 24 of the fan blades 14 with profiles that are substantially parallel to the direction of the flow F of fluid out of the outlet of the fan 10, interference of the flow F and the shroud 20 is reduced. This reduction of interference reduces friction, which increases volumetric output of the fan 10. Also, reduction of interference between the flow F and the shroud 20 reduces vibration, and thus noise, from the shroud 20 caused by the flow F impinging upon the shroud 20.

What is claimed is:

1. A cooling system for cooling a device in a computer system, comprising:
   a cooling fan including:
      an inlet,
      an outlet, and
      a plurality of fan blades, each fan blade of the plurality of fan blades having an inlet portion and an outlet portion defining an outer periphery of the fan blade; and
   a shroud surrounding at least a portion of the cooling fan, wherein
   the outlet portion having a profile defined by a radial distance perpendicular from a central axis of the fan increasing in a direction towards the outlet, and
   an average angle of a profile of the outlet portion to the central axis is between about ±5° of an average angle to the central axis at which a flow of fluid exits the outer periphery of the fan blades.

2. The cooling system according to claim 1, wherein a portion of the shroud surrounding the outlet portion is substantially parallel to the outlet portion.

3. The cooling system according to claim 1, wherein at least a portion of the outlet portion is substantially linear.

4. The cooling system according to claim 1, wherein an intersection point between the inlet portion and the outlet portion is between about 25% to about 75% of a distance between an outermost point of the inlet portion in a direction towards the inlet to an outermost point of the outlet portion in the direction towards the outlet.

5. The cooling fan according to claim 1, wherein an average angle of a profile of the inlet portion to the central axis is different than an average angle of the profile of the outlet portion to the central axis.

6. A cooling system for cooling a device in a computer system, comprising:
   a cooling fan including:
      an inlet,
      an outlet, and
      a plurality of fan blades, each fan blade of the plurality of fan blades having an inlet portion and an outlet portion defining an outer periphery of the fan blade; and
   a shroud surrounding at least a portion of the cooling fan, wherein
   an average angle of a profile of a portion of the shroud surrounding the outlet portion to a central axis of the fan is between about ±5° of an average angle to the central axis at which a flow of fluid exits the outer periphery of the fan blades.

7. The cooling system according to claim 6, wherein at least a portion of the profile of the portion of the shroud surrounding the outlet portion is substantially linear.

8. The cooling system according to claim 6, wherein an average angle of the profile of the portion of the shroud surrounding the outlet portion to the central axis is between about 20° and about 70°.

* * * * *